(12) United States Patent
Park

(10) Patent No.: US 7,602,034 B2
(45) Date of Patent: Oct. 13, 2009

(54) IMAGE SENSOR AND METHOD FOR FORMING THE SAME

(75) Inventor: Young-Hoon Park, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 231 days.

(21) Appl. No.: 11/289,192

(22) Filed: Nov. 28, 2005

(65) Prior Publication Data

US 2006/0113623 A1    Jun. 1, 2006

(30) Foreign Application Priority Data

Nov. 29, 2000  (KR)  .......................... 10-2004-98668

(51) Int. Cl.
*H01L 27/146* (2006.01)
(52) U.S. Cl. ................ 257/435; 257/E27.067
(58) Field of Classification Search ................ 257/435, 257/E27.067, E31.127
See application file for complete search history.

(56) References Cited

U.S. PATENT DOCUMENTS 6,087,685 A * 7/2000 Harada ....................... 257/232
6,570,222 B2 * 5/2003 Nozaki et al. ............... 257/347

FOREIGN PATENT DOCUMENTS

| KR | 1998-084309 | 12/1998 |
| KR | 2001-0061356 | 7/2001 |
| KR | 10-2002-0045451 | 6/2002 |
| KR | 2002-0045453 | 6/2002 |
| KR | 2002045451 A * | 6/2002 |
| KR | 10-2004-0007955 | 1/2004 |
| KR | 10-2004-0008538 | 1/2004 |

OTHER PUBLICATIONS

Notice to File a Response/Amendment to the Examination Report and English-language translation issued Aug. 31, 2006 in counterpart Korean application No. 10-2004-0098668.

* cited by examiner

*Primary Examiner*—Allan R. Wilson
(74) *Attorney, Agent, or Firm*—Mills & Onello, LLP

(57) ABSTRACT

In an image sensor and a method for forming the same, the method comprises: preparing a substrate having a pixel array region and a peripheral circuit region; sequentially stacking a gate electrode layer and a mask layer on the substrate; patterning the gate electrode layer and the mask layer to form a gate pattern; implanting impurities in the substrate in the pixel array region to form a photoelectric conversion region; and removing the mask layer.

8 Claims, 7 Drawing Sheets

IMAGE SENSOR AND METHOD FOR FORMING THE SAME

CROSS-REFERENCE TO RELATED APPLICATIONS

This U.S. non-provisional patent application claims priority under 35 U.S.C. § 119 to Korean Patent Application 2004-98668 filed on Nov. 29, 2004, the entire contents of which are hereby incorporated by reference.

BACKGROUND OF THE INVENTION

The present invention relates to an image device and a method for forming the same, more particularly, to a complementary metal oxide image device and a method for forming the same.

In a digital camera, important elements in determining the resulting image quality include an optical lens and an image sensor. Light received through a lens is converted into an electric signal by an image sensor. In this manner, a high-quality image can be obtained.

An image sensor consists of a pixel array, namely, a plurality of pixels arranged in a two-dimensional matrix, each pixel including a photosensing means, and transfer and read-out devices. Image sensors can be classified into charge-coupled device-type CCD image sensors (referred to as "a CCD", hereinafter) and complementary metal oxide semiconductor CMOS-type image sensors (referred to as "a CIS", hereinafter) in accordance with the devices used for transfer and readout. The CCD uses a MOS capacitor for transfer and readout operations. Individual MOS capacitors are located in close proximity to each other, and a charge carrier is tored in a capacitor by a potential difference and transferred into the neighboring capacitor. In contrast, the CIS adopts a switching method by sequentially sensing outputs using MOS transistors as pixels.

The CCD generates less noise in comparison with the CIS, and produces a high quality image, while the CIS is advantageous in that it has a low unit cost of production and low power dissipation. In other words, the CIS is advantageous in that it offers a low power function, a single voltage current, low power dissipation, compatibility with an incorporated CMOS circuit, random access of image data and overall cost reduction, owing to the use of a standard CMOS technology. Accordingly, the CIS has been extended to diversely applied fields such as digital cameras, smart phones, personal data assistants (PDAs), notebook computers, surveillance cameras, barcode detectors, HDTV resolution cameras and various electronic toys.

Contrary to the CCD, the CIS is suitable for integrating an analog device and a MOS device in a single chip using a MOS process. With the continuing trend toward ever-higher integration in semiconductor devices, the gate pattern of a MOS transistor formed in a peripheral circuit-regions has a height that is continually decreasing. If the gate pattern is too high, then an aspect ratio of a space defined between gate patterns is great. Thus, halo ion implantation under these conditions is impossible. Accordingly, it is preferable that a gate pattern of a MOS transistor in a pixel array region is formed to a same height as that of a MOS transistor in the peripheral circuit region.

FIG. 1 is a cross-sectional view illustrating a part of a pixel array region of a conventional image sensor.

Referring to FIG. 1, a device isolation layer 10 is provided at a predetermined region of a semiconductor substrate 100. The device isolation layer 110 defines each pixel active region. After a photoresist layer 130 is formed on top of the gate pattern 120, N-type impurities 140 are ion-implanted to form a photoelectric conversion region 150. At this time, the photoelectric conversion region 150 is formed in a self-aligned manner, to be aligned with the gate pattern 120. However, if the gate pattern 120 is formed relatively thin, the implanted impurity ions with an appropriately 500 keV energy penetrate through the gate pattern 120 to form an undesired N-type impurity diffusion region 160 at a lower portion of the gate pattern 120. As a result, the threshold voltage of a MOS transistor is difficult to control, and a reliable image sensor can not be realized.

SUMMARY OF THE INVENTION

In order to achieve the above objects of the present invention, the present invention is directed to an image sensor in which a self-aligned photoelectric conversion region is formed on a gate pattern of a pixel array region, and a method thereof, in a manner whereby a relatively thin gate pattern is maintained in a peripheral circuit region.

In one aspect, the present invention is directed to a method for manufacturing an image sensor comprising: preparing a substrate having a pixel array region and a peripheral circuit region; sequentially stacking a gate electrode layer and a mask layer on the substrate; patterning the gate electrode layer and the mask layer to form a gate pattern; implanting impurities in the substrate in the pixel array region to form a photoelectric conversion region; and removing the mask layer.

In one embodiment, the invention further comprises, after removing the mask layer, further comprising implanting impurities in the substrate in the peripheral circuit region to form a source/drain region.

In another embodiment, the invention further comprises, before implanting impurities in the peripheral circuit region, forming an insulating layer.

In another embodiment, the mask layer is formed of at least one of a silicon oxide $SiO_2$ layer and a silicon oxide nitride SiON layer.

In another embodiment, removing the mask layer is performed using a mixed solution of ammonium hydroxide $NH_4OH$, hydrogen fluoride HF and deionized water.

In another embodiment, removing the mask layer is performed using a mixed solution of hydrogen fluoride HF, hydrogen peroxide $H_2O_2$ and deionized water.

In another embodiment, the gate electrode layer has a thickness from about 500 and 2000 Å, and the mask layer has a thickness from about 700 and 1700 Å.

In another embodiment, the photoelectric conversion region is of an N-type.

In another embodiment, the invention further comprises forming a P-type HAD region on the photoelectric conversion region.

In another aspect, the present invention is directed to a method for manufacturing an image sensor comprising: preparing a substrate having a pixel array region and a peripheral circuit region; sequentially stacking a gate electrode layer and a mask layer on the substrate; patterning the gate electrode layer and the mask layer to form a gate pattern; removing the mask layer in the peripheral circuit region; and implanting impurities in the substrate in the pixel array region to form a photoelectric conversion region.

In one embodiment, the invention further comprises implanting impurities in the substrate in the peripheral circuit region to form a source/drain region.

In another embodiment, the invention further comprises forming an insulating layer before implanting impurities in the peripheral circuit region.

In another embodiment, the mask layer is formed of at least one of a silicon oxide $SiO_2$ layer and a silicon oxide nitride SiON layer.

In another embodiment, removing the mask layer is performed using a mixed solution of ammonium hydrogen $NH_4OH$, hydrogen fluoride HF and deionized water.

In another embodiment, removing the mask layer is performed using a mixed solution of hydrogen fluoride HF, hydrogen peroxide $H_2O_2$ and deionized water.

In another embodiment, the photoelectric conversion region is of an N-type.

In another embodiment, the invention further comprises forming a P-type HAD region on the photoelectric conversion region.

In another aspect, the present invention is directed to an image sensor comprising: a semiconductor substrate having a pixel array region and a peripheral circuit region; the first gate pattern consisting of a gate electrode layer and a mask layer in the pixel array region; and the second gate pattern consisting of only a gate electrode layer in the peripheral circuit region.

In one embodiment, the mask layer comprises one of a silicon oxide layer $SiO_2$ and a silicon oxide nitride SiON layer.

In another embodiment, the invention further comprises a photoelectric conversion region in the semiconductor substrate self-aligned with the first gate pattern on the semiconductor substrate in the pixel array region.

In another embodiment, the photoelectric conversion region is of an N-type.

In another embodiment, the invention further comprises a P-type HAD region on the photoelectric conversion region.

In another embodiment, the gate electrode layer has a thickness ranging from about 500 to 2000 Å, and the mask layer has a thickness ranging from about 700 to 1700 Å.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF EMBODIMENTS OF THE INVENTION

Figure 1:
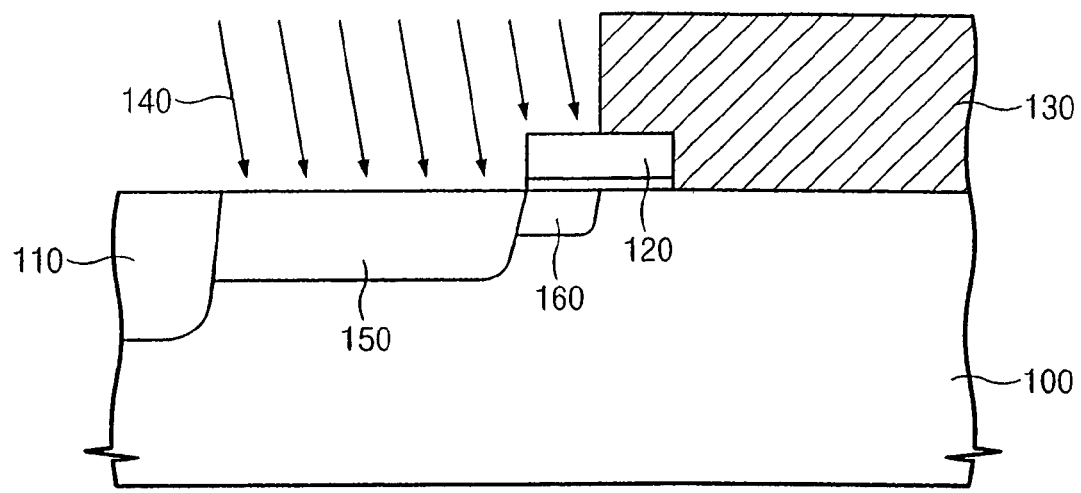
FIG. 1 is a cross-sectional view illustrating a portion of a pixel array region of a conventional image sensor.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete. In the drawings, the thickness of layers and regions are exaggerated for clarity. It will also be understood that when a layer is referred to as being "on" another layer or substrate, it can be directly on the other layer or substrate or intervening layers may also be present.

Figure 2:
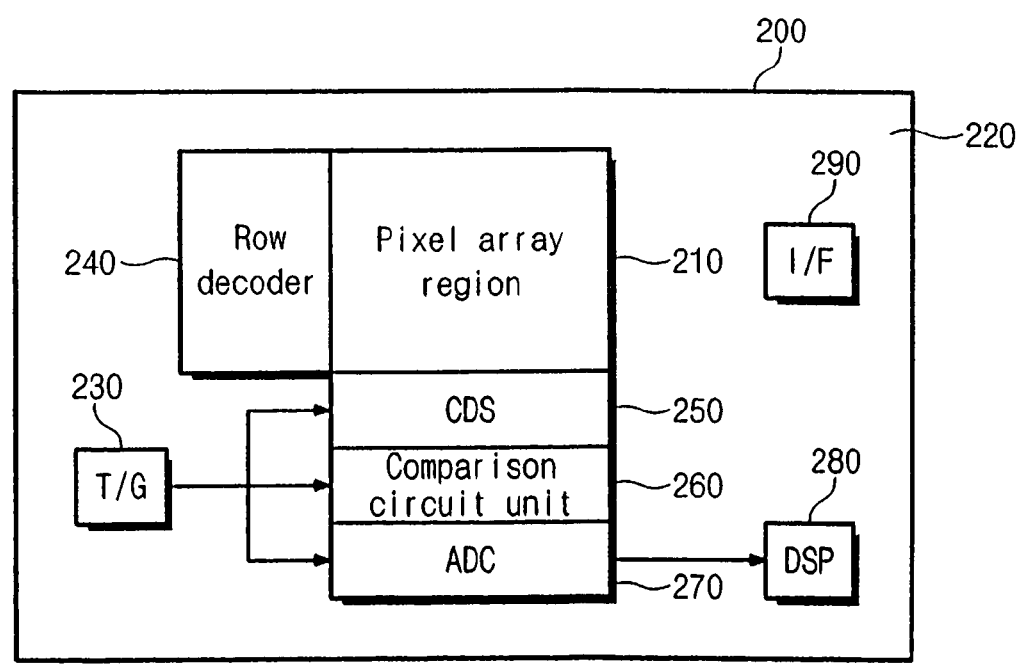
FIG. 2 is a block diagram of an image sensor to which the present invention is applicable.

FIG. 2 is a block diagram of an image sensor to which the present invention is applied. Referring to FIG. 2, an image sensor 200 according to embodiments of the present invention consists of a pixel array region 210 where photoelectric conversion devices are two-dimensionally arranged, and a peripheral circuit region 220 consisting of a timing generator 230 generating timing signals required for reading out signals from a pixel, a row decoder 240 for selecting a pixel, a CDS unit 250 performing a correlated double sampling to a signal outputted from the selected pixel, a comparison circuit unit 260, a transformer ADC 270 transforming an analog signal output from the comparison circuit unit 260 into a digital signal, a DSP 280 transforming the digital signal to a digital image signal and an interface I/F 290 outputting a digital image signal to an external unit and receiving external command data.

FIGS. 3A to 3G are cross-sectional views illustrating a method for manufacturing an image sensor in accordance with the first embodiment of the present invention.

Figure 3A:
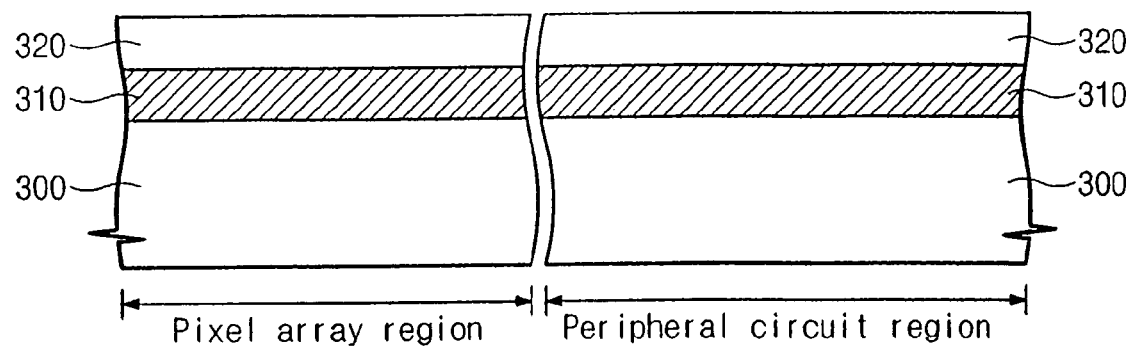
FIGS. 3A to 3G are cross-sectional views illustrating fabrication of an image sensor in accordance with a first embodiment of the present invention.

Referring to FIG. 3A, a gate electrode layer 310 and a mask layer 320 are sequentially stacked on a substrate 300 having a pixel array region and a peripheral circuit region enclosing the pixel array region. The gate electrode layer 310 may be formed of a polysilicon conductive layer with a thickness of 500 through 2000 Å, and the mask layer 320 may be formed of a material layer having an etch selectivity with respect to the gate electrode layer 310. Furthermore, the mask layer 320 can play a role as a reflection prevention layer during gate patterning. For example, the mask layer 320 can be formed of a silicon oxide layer $SiO_2$ or a silicon oxide nitride layer SiON with a thickness ranging from about 300 to 1700 Å.

Figure 3B:
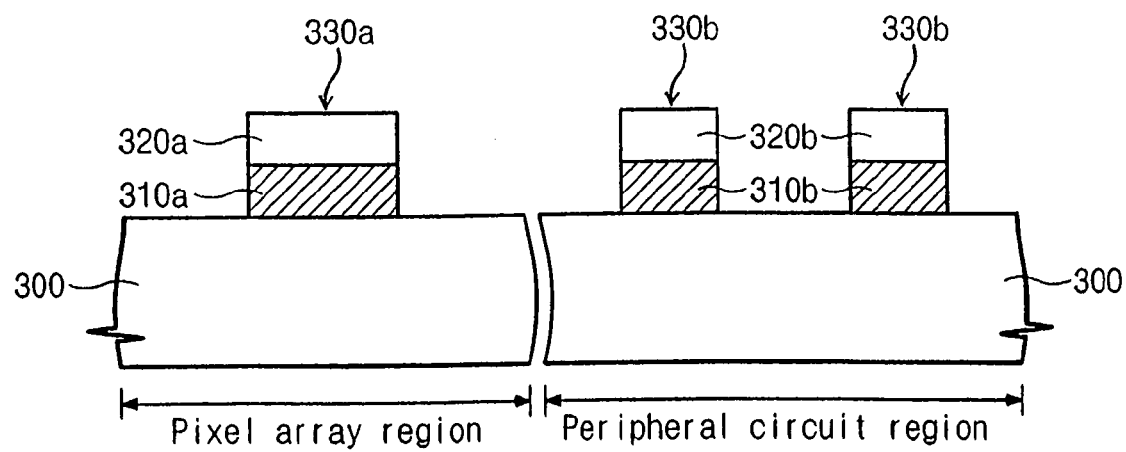

Referring to FIG. 3B, gate patterns 330a and 330b are formed at a pixel array region and a peripheral circuit region of the device, respectively, using a photoresist etching process. The photolithographic etching process comprises: forming patterned mask layers 320a and 320b using a photoresist (not shown) and etching the gate electrode layer 310 using the patterned mask layers 320a and 320b as an etching prevention layer to complete gate patterns 330a and 330b.

Figure 3C:
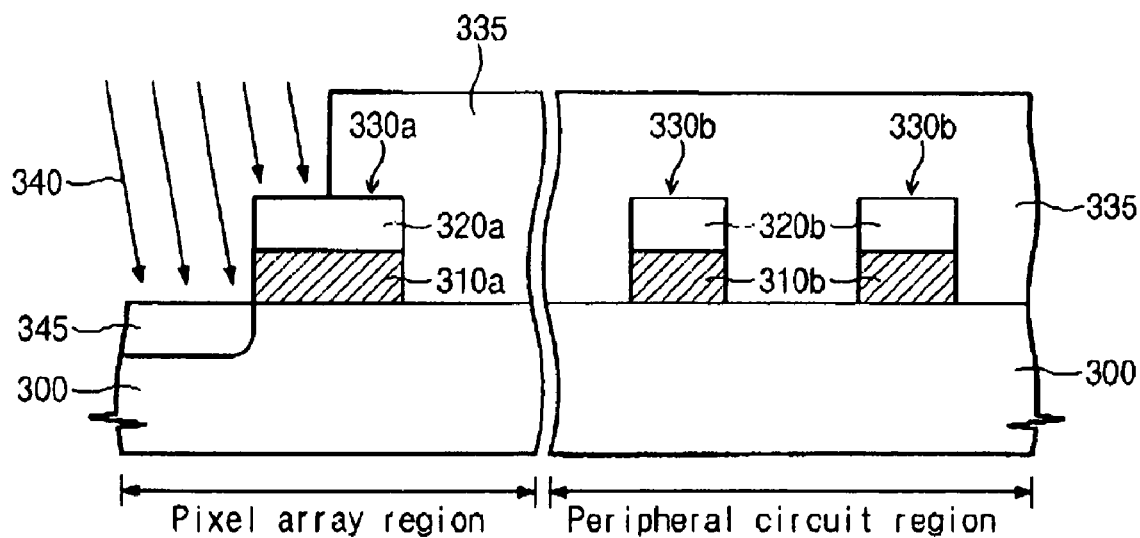

Referring to FIG. 3C, an entire peripheral circuit region and a part of a pixel array region are masked with a photoresist layer 335, and N-type impurities 340 are ion-implanted to form a photoelectric conversion region 345. At this time, the photoresist layer 335 covers a portion of an upper portion of the gate pattern 330a in the pixel array region 210. The N-type impurities 340 do not penetrate through the gate pattern 330a because of its thickness, and forms a photoelectric conversion region 345 that is self-aligned with the gate pattern 330a. In an example where Arsenic As is used as an N-type impurity 340, the implanting energy will range from 200 to 700 keV.

Figure 3D:
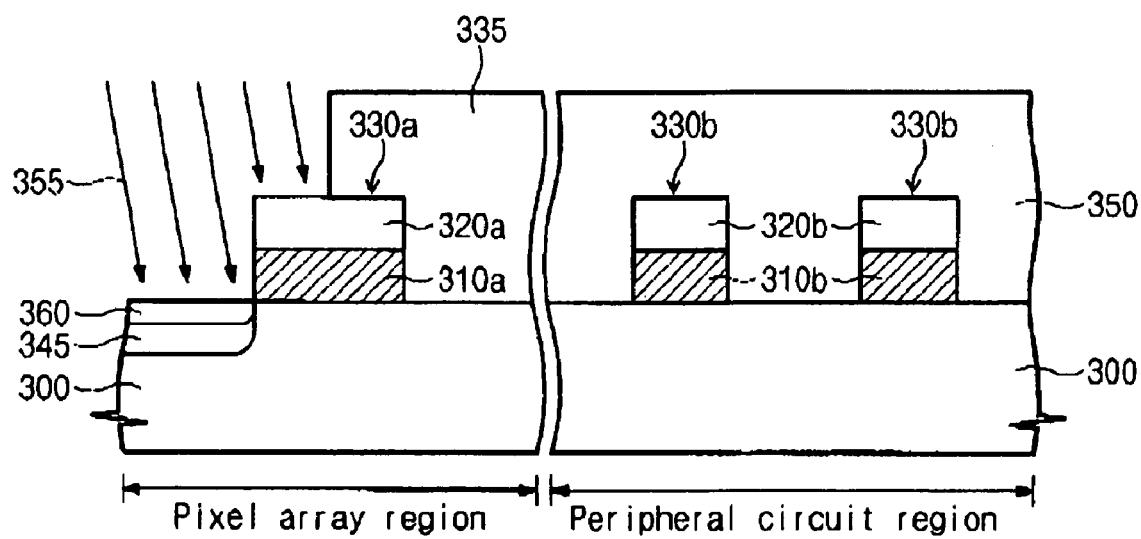

Referring to FIG. 3D, using the photoresist layer 335 as an ion implantation mask, P-type impurities 355 are ion-implanted to form a P-type HAD region 360. In an example where di-boron fluoride $BF_2$ is used as the P-type impurities, the implanting energy will be about 50 keV at about a $5\times10^{13}/cm^2$ dose. In an alternative embodiment, photoresist layer 335 of FIG. 3C is removed and a new photoresist layer is formed in FIG. 3D.

Figure 3E:
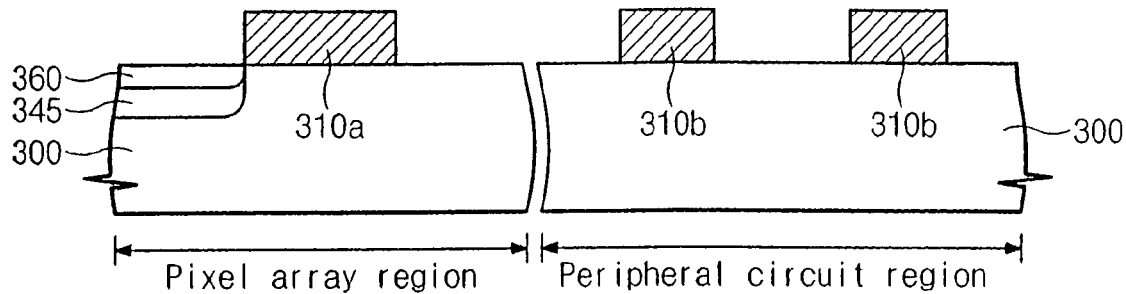

Referring to FIG. 3E, the photoresist layer 350 and the patterned gate layers 320a and 320b are removed using a wet-etching process to leave the patterned gate layers 310a and 310b. For example, the wet etching process is carried out using a mixed solution of ammonium hydroxide $NH_4OH$, hydrogen fluoride HF and deionized water or a mixed solution of hydrogen fluoride HF, hydrogen peroxide $H_2O_2$ and deionized water.

Figure 3F:
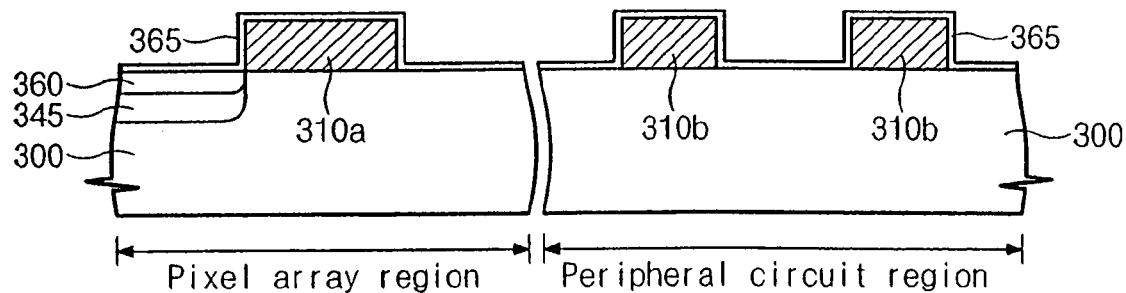
Figure 3G:
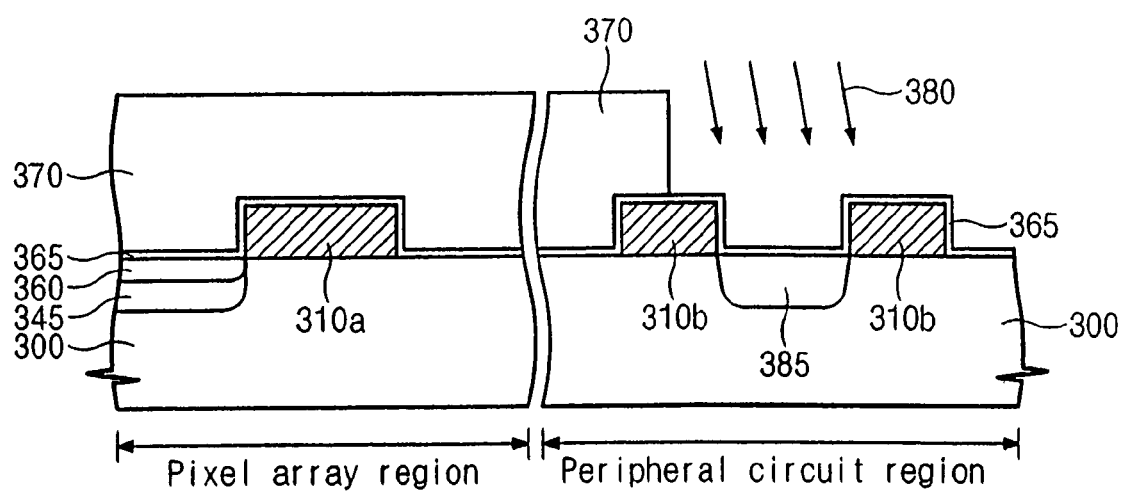

Referring to FIG. 3F, an insulating layer 365 is deposited in order to prevent the exposed upper surface of the substrate from being damaged during further ion implanting. Referring to FIG. 3G, an entire pixel array region and a portion of the peripheral circuit region are masked with the photoresist layer 370, and impurities 380 are ion-implanted to form a source/drain region 385. At this time, in order to form a N-type transistor, N-type impurities are implanted, and in order to form a P-type transistor, P-type impurities are implanted. A lightly doped diffusion region may optionally also be formed using implanted impurities.

Figure 4A:
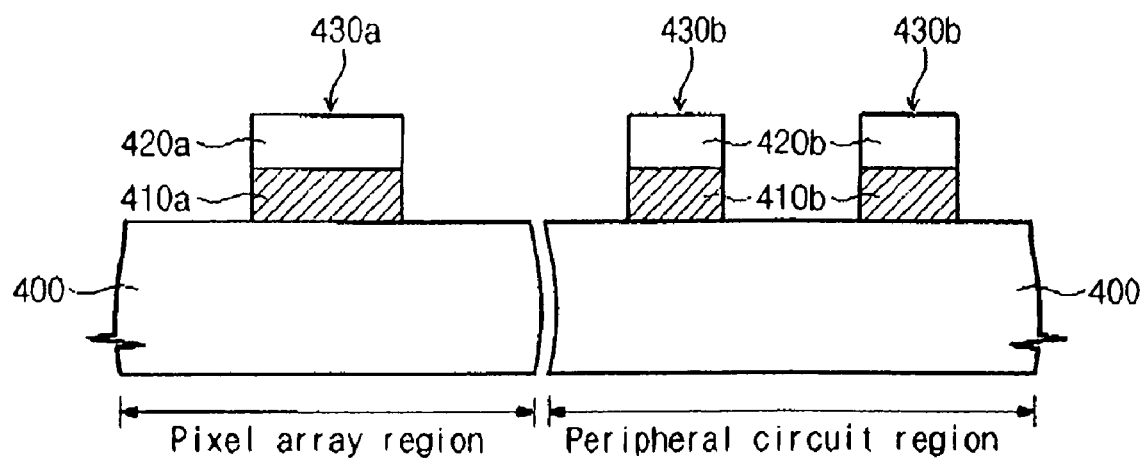
FIGS. 4A to 4F are cross-sectional views illustrating fabrication of an image sensor in accordance with a second embodiment of the present invention.

FIGS. 4A to 4F are cross-sectional views illustrating a method for manufacturing an image sensor in accordance with a second embodiment of the present invention. Referring to FIG. 4A, a gate pattern 430a in a pixel array region and a gate pattern 430b in a peripheral circuit region are formed by a patterning process as in the first embodiment. The gate patterns 430a and 430b consist of patterned gate electrode layers 410a and 410b and patterned mask layers 420a and 420b. The gate electrode layers 410a and 410b can be formed, for example, of a polysilicon conductive layer with a thickness of 500 through 2000 Å, and the mask layers 420a and 420b can be formed of a material layer having an etch selectivity with respect to the gate electrode layers 410a and 410b. Furthermore, the mask layers 420a and 420b can operate as a reflection prevention layer during gate patterning. For example, the mask layers 420a and 420b can be formed of a silicon oxide layer $SiO_2$ or a silicon oxide nitride layer SiON with a thickness of 300 through 1700 Å.

Figure 4B:
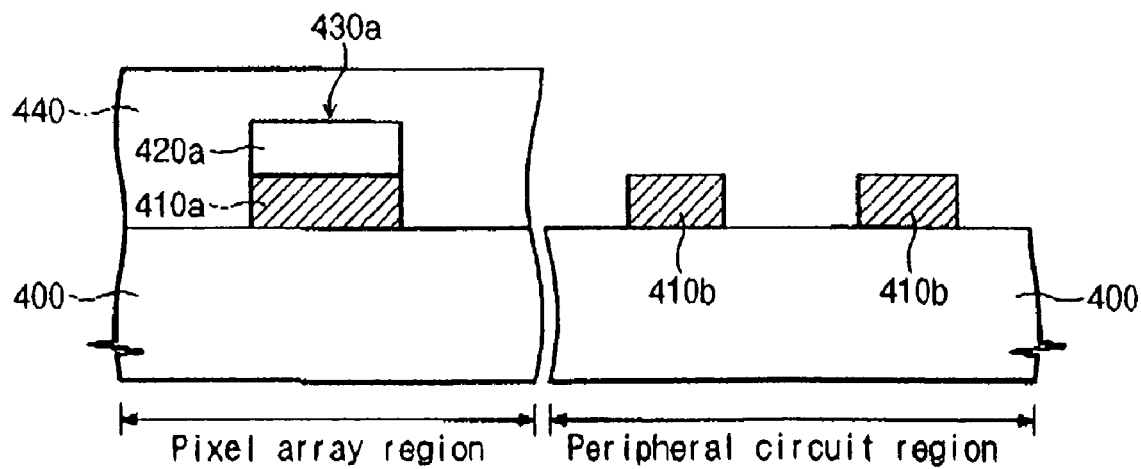

Referring to FIG. 4B, the pixel array region is masked with a photoresist layer 440, the patterned mask layer 420b in a peripheral circuit region is removed using a wet etching process and a patterned gate layer 410b remains. The wet etching process is carried out using, for example, a mixed solution of ammonium hydroxide $NH_4OH$, hydrogen fluoride HF and deionized water or a mixed solution of hydrogen fluoride HF, hydrogen peroxide $H_2O_2$ and deionized water. The photoresist layer is then removed according to conventional processes.

Figure 4C:
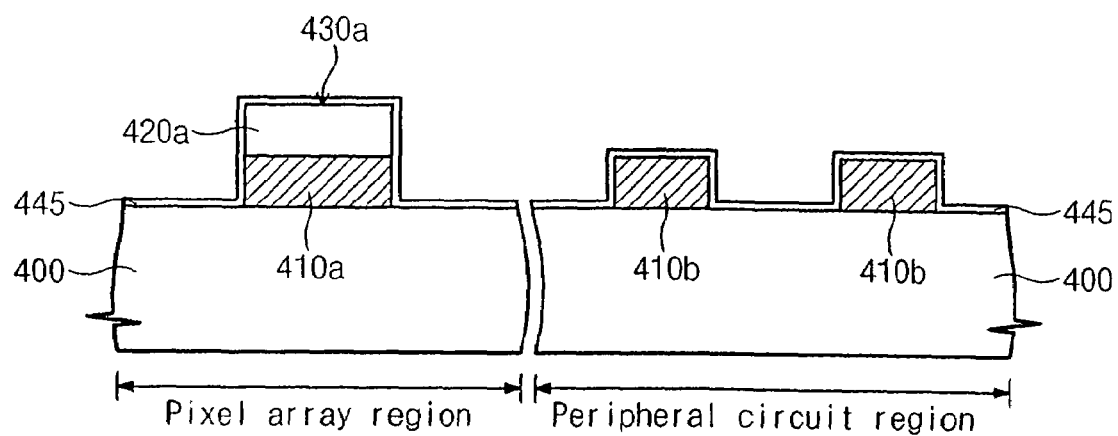

Referring to FIG. 4C, an insulating layer 445 is deposited in order to prevent a surface of a substrate from being damaged during ion implantation.

Figure 4D:
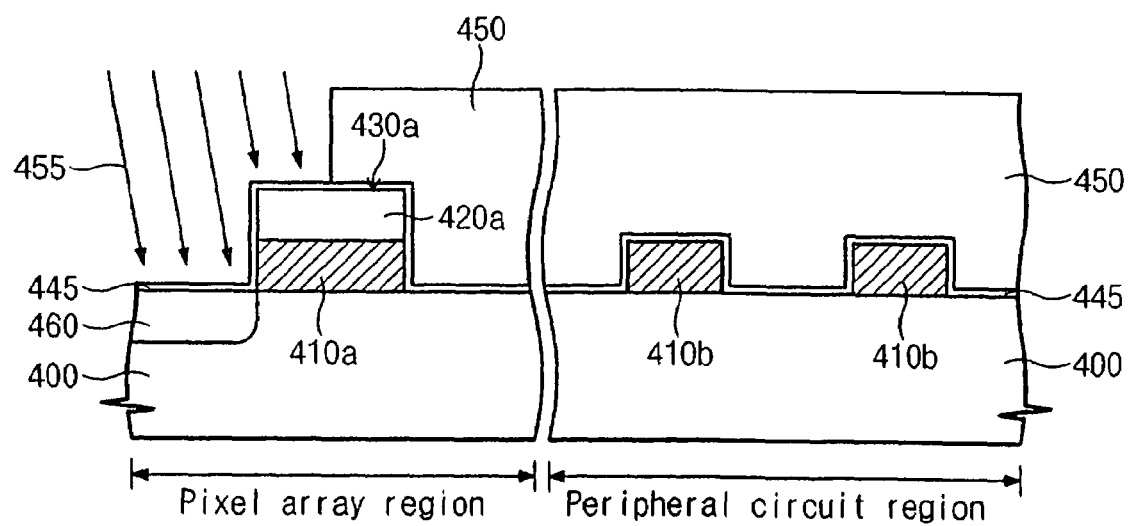

Referring to FIG. 4D, the entire peripheral circuit region and a portion of the pixel array region are masked using a photoresist layer 450, and N-type impurities 455 are ion-implanted to form a photoelectric conversion region 460. At this time, the photoresist layer 450 covers a part of an upper portion of the gate pattern 430a in the pixel array region. The N-type impurities 455 do not penetrate through the gate pattern 430a because of its thickness, and a self-aligned photoelectric conversion region 460 is thereby formed at a side of the gate pattern 430a. In an example where Arsenic As is used as the N-type impurities 455, the implanting energy will range from 200 to 700 keV.

Figure 4E:
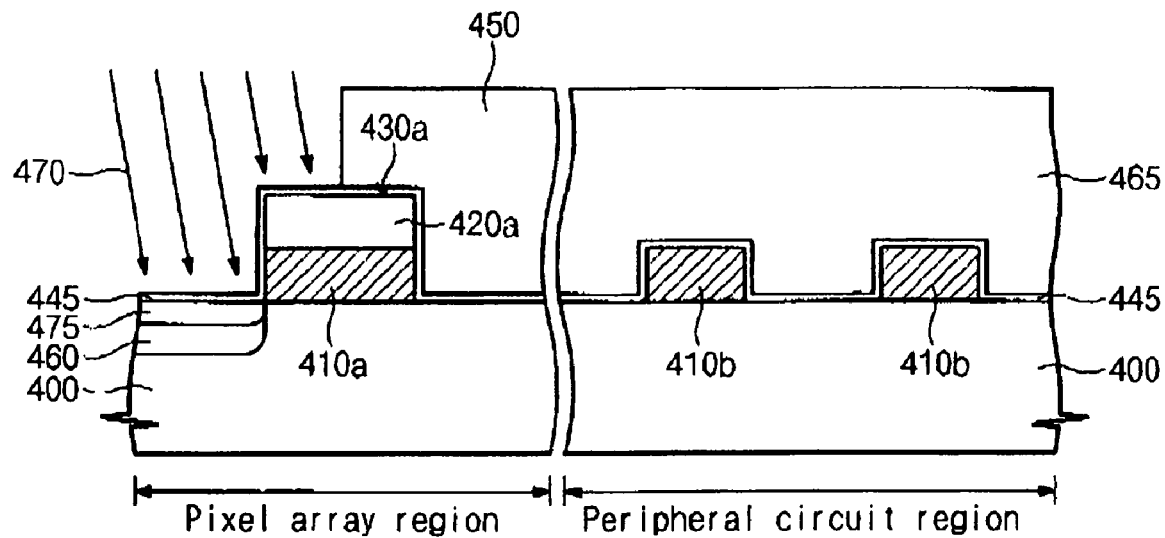

Referring to FIG. 4E, the photoresist layer 450 as an ion implantation mask, P-type impurities 470 are ion-implanted to form a P-type HAD region 475. In a case where di-boron fluoride $BF_2$ is used as the P-type impurities, the implanting energy would be about 50 keV and the dose can be about $5 \times 10^{13}/cm^2$. In an alternative embodiment, photoresist layer 450 of FIG. 4D is removed and a new photoresist layer is formed in FIG. 4E.

Figure 4F:
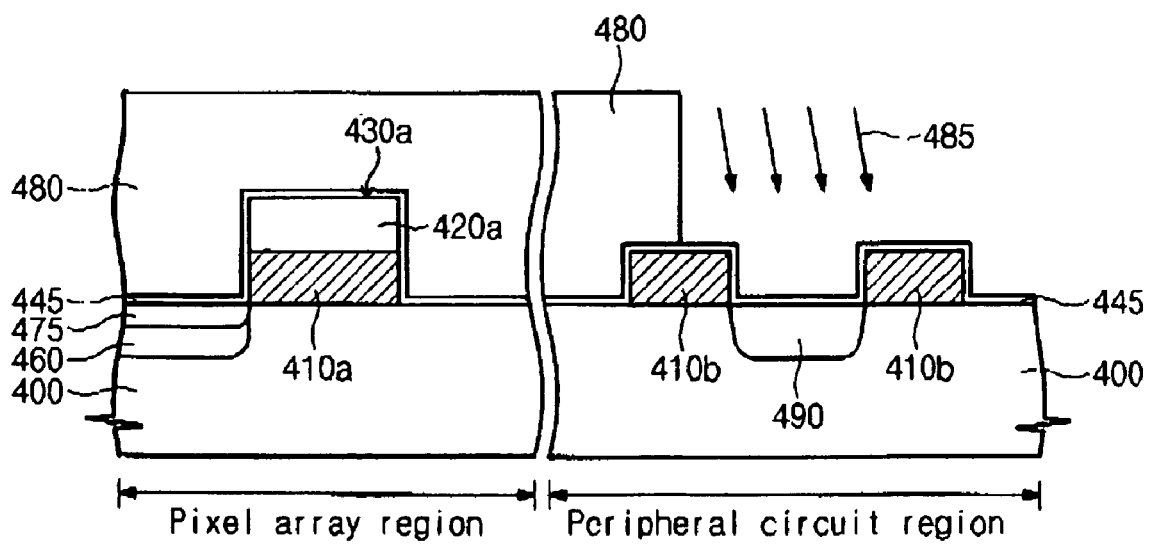

Referring to FIG. 4F, following formation of the HAD region 475, photoresist layer 465 is removed and the entire pixel array region and a portion of the peripheral circuit region are covered with photoresist layer 480. Impurities 480 are then ion-implanted to form a source/drain region 490 in the peripheral circuit region. In order to form a N-type transistor, N-type impurities can be implanted, and in order to form a P-type transistor, P-type impurities can be implanted. A lightly doped diffusion region can optionally be formed using impurity implantation.

While this invention has been particularly shown and described with references to preferred embodiments thereof, it will be understood by those skilled in the art that various changes in form and details may be made herein without departing from the spirit and scope of the invention as defined by the appended claims.

According to the embodiments of the present invention described as above, a self-aligned photoelectric conversion region is formed in a pixel array region, securing transistor driving capability in a peripheral circuit region, while maintaining a relatively thin gate pattern in the peripheral circuit region.

What is claimed is:

1. An image sensor comprising:
   a semiconductor substrate having a pixel array region and a peripheral circuit region;
   a first gate pattern consisting of a gate electrode layer pattern and a mask layer pattern in the pixel array region, wherein the mask layer pattern is on a top surface of the gate electrode layer pattern, the gate electrode layer pattern being between the semiconductor substrate and the mask layer pattern, and the mask layer pattern having a width that is substantially the same as a width of the gate electrode layer pattern; and
   a second gate pattern consisting of only a gate electrode layer pattern in the peripheral circuit region.

2. The image sensor of claim 1, wherein the mask layer pattern comprises one of a silicon oxide layer $SiO_2$ and a silicon oxide nitride SiON layer.

3. The image sensor of claim 2, further comprising a photoelectric conversion region in the semiconductor substrate self-aligned with the first gate pattern on the semiconductor substrate in the pixel array region.

4. The image sensor of claim 3, wherein the photoelectric conversion region comprises N-type impurities.

5. The image sensor of claim 4, further comprising a P-type HAD region on the photoelectric conversion region.

6. The image sensor of claim 1, wherein the gate electrode layer pattern has a thickness ranging from about 500 to 2000 Å, and the mask layer pattern has a thickness ranging from about 700 to 1700 Å.

7. The image sensor of claim 1 further comprising an insulating layer directly on the mask layer pattern of the first gate pattern and directly on the gate electrode layer pattern of the second gate pattern.

8. The image sensor of claim 1, wherein the mask layer pattern is only on the top surface of the gate electrode layer pattern.

* * * * *

UNITED STATES PATENT AND TRADEMARK OFFICE
CERTIFICATE OF CORRECTION

| | | |
|---|---|---|
| PATENT NO. | : 7,602,034 B2 | Page 1 of 1 |
| APPLICATION NO. | : 11/289192 | |
| DATED | : October 13, 2009 | |
| INVENTOR(S) | : Young-Hoon Park | |

It is certified that error appears in the above-identified patent and that said Letters Patent is hereby corrected as shown below:

On the first page, Foreign Application Priority Date (30), remove "Nov. 29, 2000" and insert --Nov. 29, 2004--

Column 5, line 58 between "4E," and "the", insert --using--

Signed and Sealed this

Nineteenth Day of January, 2010

David J. Kappos
*Director of the United States Patent and Trademark Office*